United States Patent [19]
Hughes

[11] Patent Number: 6,133,765
[45] Date of Patent: Oct. 17, 2000

[54] SWITCHED-CURRENT MEMORY

[75] Inventor: John B. Hughes, Hove, United Kingdom

[73] Assignee: U.S. Philips Corporation, New York, N.Y.

[21] Appl. No.: 09/162,791

[22] Filed: Sep. 29, 1998

[30] Foreign Application Priority Data

Oct. 1, 1997 [GB] United Kingdom .................... 9720740

[51] Int. Cl.$^7$ .................................................. H03K 5/153
[52] U.S. Cl. ................................................. 327/90; 327/96
[58] Field of Search ................................. 327/91, 93, 94, 327/96, 97, 90

[56] References Cited

U.S. PATENT DOCUMENTS

| | | | |
|---|---|---|---|
| 5,179,301 | 1/1993 | Hughes | 327/335 |
| 5,349,245 | 9/1994 | Hughes et al. | 327/91 |
| 5,400,273 | 3/1995 | Hughes et al. | 365/45 |
| 5,666,303 | 9/1997 | Hughes et al. | 365/45 |
| 5,714,894 | 2/1998 | Redman-White et al. | 327/94 |
| 5,783,952 | 7/1998 | Kazazian | 327/94 |

OTHER PUBLICATIONS

"A Low–Voltage Switched–Current Delta–Sigma Modulator", Nianxiong Tan et al, IEEE J. of Solid State Circuits, vol. 30, No. 5, May 1995, pp. 599–603.

"Switched–Current Signal Processing for Video Frequencies and Beyond", John B. Hughes et al, IEEE J. of Solid–State Circuits, vol. 28, No. 3, Mar. 1993, pp. 314–322.

*Primary Examiner*—Timothy P. Callahan
*Assistant Examiner*—Hai L. Nguyen
*Attorney, Agent, or Firm*—Brian J. Wieghaus

[57] ABSTRACT

A switched current memory circuit has an input to which an input current (i) is applied and which is connected via a switch (S1) to the drain electrode of a memory transistor (M). A second switch (S3) is connected between the memory circuit input and the source electrode of a grounded gate transistor (G) whose drain electrode is connected to the gate electrode of the memory transistor (M). The drain electrode of the memory transistor (M) is connected via switch (S2) to an output at which an output current ($i_o$) is produced.

The second switch (S3) provides zero-voltage switching which reduces the effects of charge injection on the current stored.

16 Claims, 4 Drawing Sheets

SWITCHED-CURRENT MEMORY

BACKGROUND OF THE INVENTION

1. Field of the Invention

The invention relates to a switched-current memory circuit.

2. Description of Related Art

FIG. 1 shows two known switched-current memory circuits or cells, the grounded-gate memory and the zero-voltage switching memory.

The grounded-gate memory shown in FIG. 1a has been disclosed in a paper entitled "Switched-Current Signal Processing for Video Frequencies and Beyond" by J B Hughes and K W Moulding and published in IEEE Journal of Solid-State Circuits, Vol 28, No 3, March 1993, pp 314–322 and uses a non-inverting voltage amplifier G to reduce non-ideal behaviour resulting from finite memory transistor $g_m/g_o$. However, the charge injection from switch S3 is unchanged and becomes the dominant sampling error. It is signal-dependent and so causes harmonic distortion as well as offset and gain errors.

The zero-voltage switching memory shown in FIG. 1b has been disclosed in a paper entitled "Zero-Voltage Switching in Switched-Current Circuits" by D G Nairn published in the Digest of papers of IEEE International Symposium on Circuits and Systems, 1994, pp 289–292 and uses a virtual-earth inverting amplifier A to reduce $g_m/g_o$ errors. Further, as the memory switch is placed at the amplifier's virtual earth the charge injection from the switch S3 is dumped onto capacitor $C_m$ to produce a signal-independent sampling error. This is less troublesome because it is only an offset error. However, the cell consumes more power, generates more noise and the more complex loop gives higher order settling behaviour which limits the cell's effective bandwidth.

BRIEF SUMMARY OF THE INVENTION

It is an object of the invention to enable the provision of a switched-current memory cell in which the effects of one or more of the disadvantages of the prior art circuits referred to above can be mitigated.

The invention provides a switched-current memory circuit comprising an input which is connected via a first switch to the drain electrode of a field effect transistor and via a second switch to the gate electrode of the transistor, the path between the input and the gate electrode of the transistor further including a grounded gate amplifier, and an output connected via third switch to the drain electrode of the transistor, in which the first and second switches are closed during a first portion of a clock period and the third switch is closed during a second non-overlapping portion of the clock period or a subsequent clock period and the second switch is connected between the input of the memory circuit and the input of the amplifier.

Such memory cell effects both charge injection and $g_m/g_o$ error reduction through zero-voltage switching in the grounded-gate memory.

The second switch may comprise a first field effect transistor connected in series with a second field effect transistor whose source and drain electrodes are shorted together and whose drain electrode is driven during the second portion of the clock period.

This enables a further reduction in charge injection as the action of the second transistor is such as to cancel injected charge from the first transistor.

A further field effect transistor may be connected in between the first switch and the drain electrode of the first mentioned transistor, the drain electrode of the further transistor being connected to a potential source which causes it to be conductive.

The further field effect transistor serves to compensate for the voltage drop on the output transistor. This is explained in greater detail in EP-A-0789920 (PHB34007).

A memory circuit for storing balanced currents may be formed by two current memory circuits as set forth above. This will produce a more constant differential transconductances so that any residual error at the gate of the memory transistor of each of the current memory circuits translates to an offset error in the differential output.

This invention further provides a differential current memory circuit comprising first and second field effect transistors connected as a differential pair, first and second inputs which are connected via respective first switches to the drain electrodes of the first and second transistors and via respective second switches and respective grounded gate amplifiers to the gate electrodes of the first and second transistors, and first and second outputs connected via respective third switches to the drain electrodes of the first and second transistors, wherein the first and second respective switches are closed during a first portion of a clock period and the third respective switches are closed during a second non-overlapping portion of the clock period or a subsequent clock period.

The voltage at the junction of the first and second transistors may be arranged to control the bias currents to the grounded gate amplifiers.

This reduces the effect of both common mode input signals and charge injection errors from the respective second switches.

BRIEF DESCRIPTION OF THE DRAWINGS

The above and other features and advantages of the present invention will be apparent from the following description, by way of example, of embodiments of current memory cells with reference to the accompanying drawings, in which.

DETAILED DESCRIPTION OF THE INVENTION

Figure 1A:
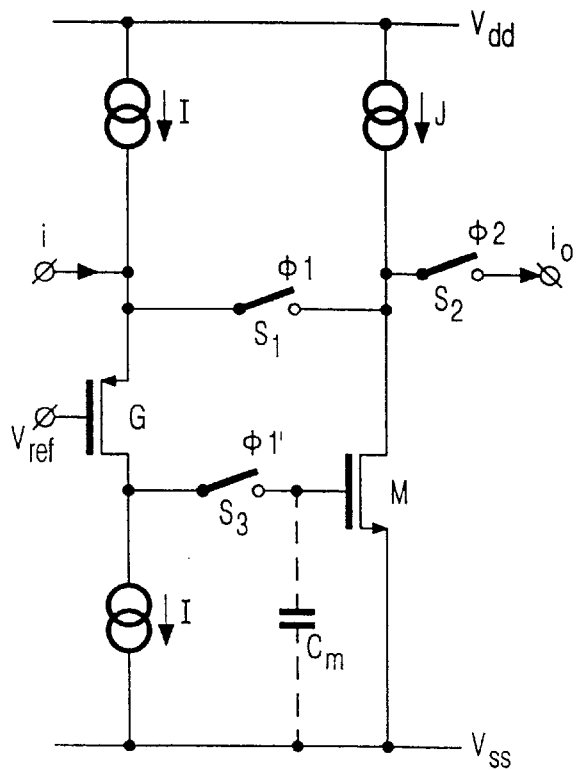
FIGS. 1a and 1b show circuit diagrams of prior art current memory cells.
Figure 1B:
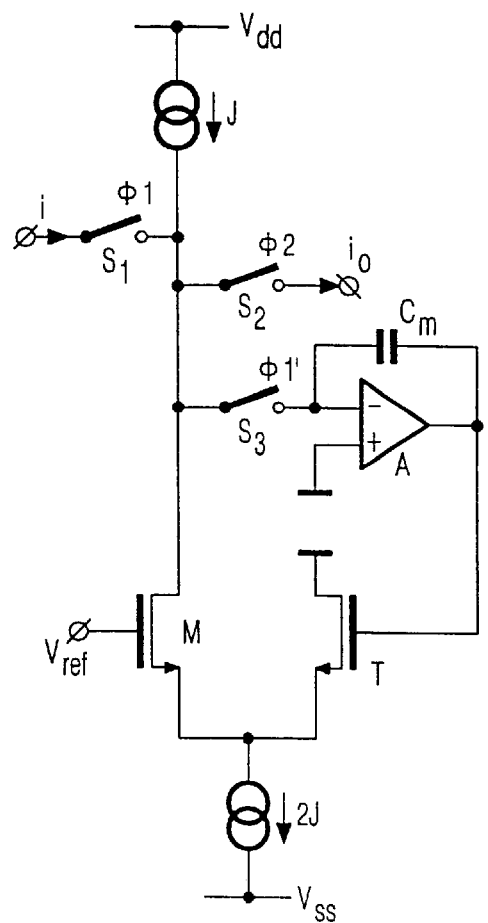
Figure 1C:
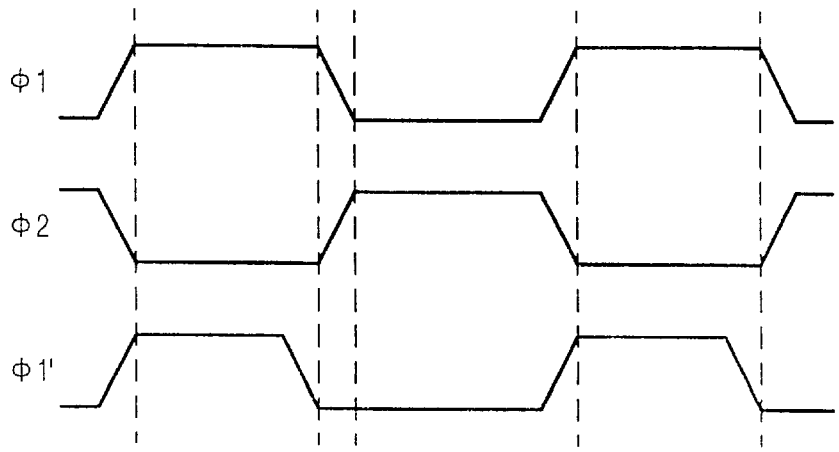
FIG. 1c shows switching waveforms for the switches in the current memory cells of both the prior art memory cells and the embodiments shown in FIGS. 2a, 2b, 2c and 3 hereof.
Figure 2A:
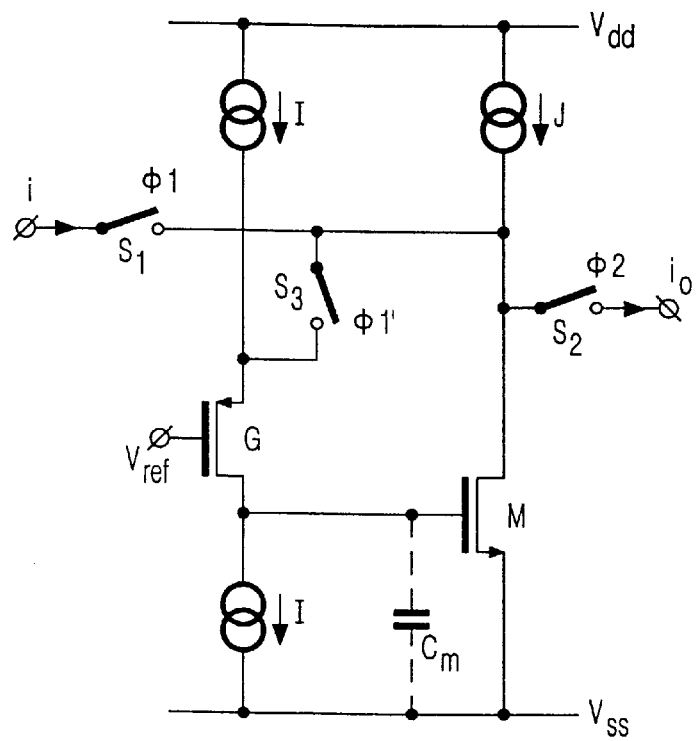
FIG. 2a shows a first embodiment of a current memory cell according to the invention.
Figure 2B:
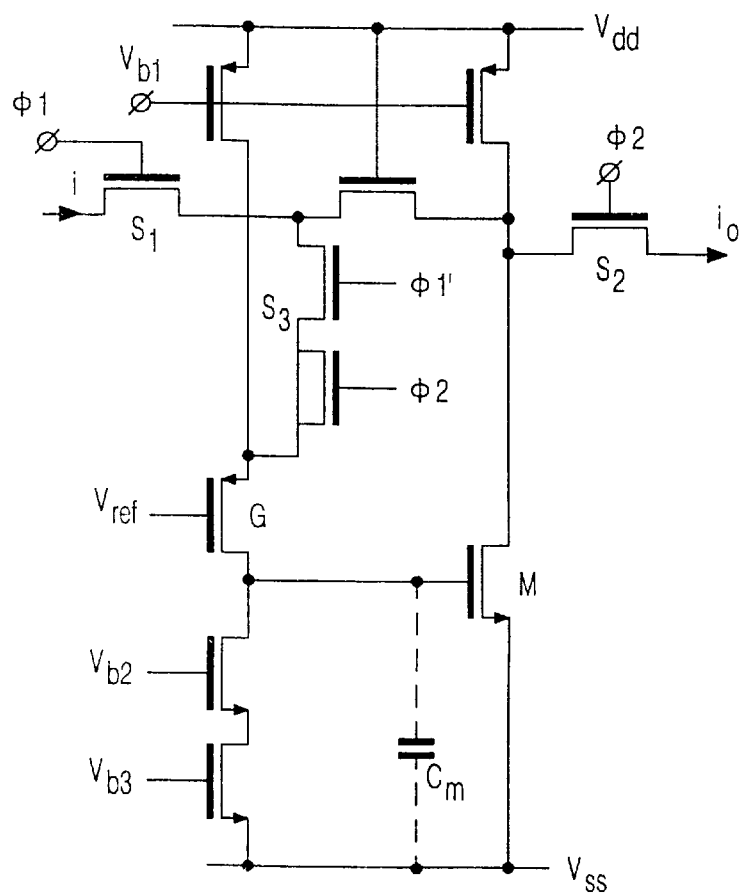
FIG. 2b shows a second embodiment of a current memory cell according to the invention.
Figure 2C:
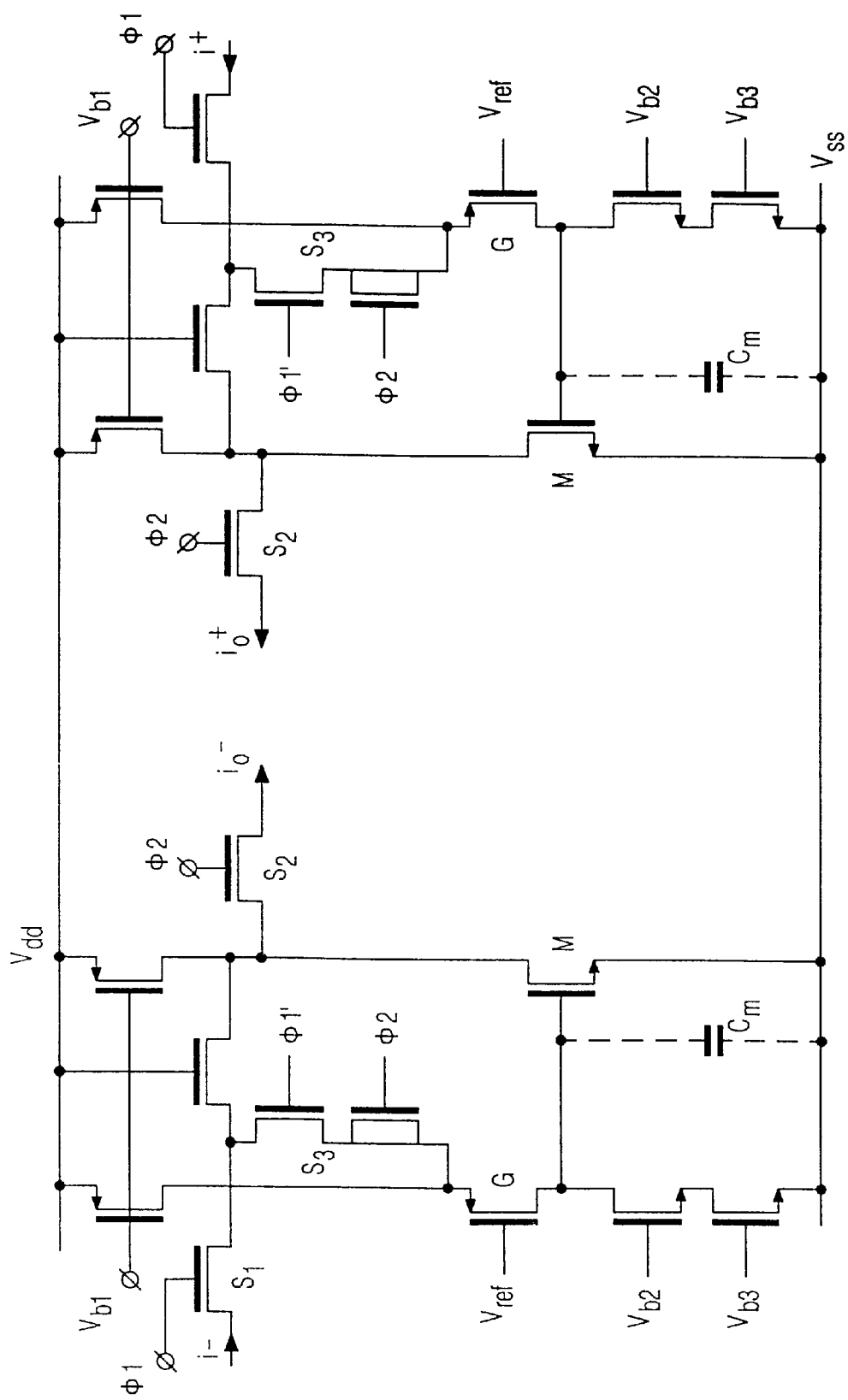
FIG. 2c shows a third embodiment of a current memory cell according to the invention.

Referring to FIG. 2a, the cell is similar to the grounded-gate memory (FIG. 1a) except that there is no switch in the gate of the memory transistor M and the input switch S1 connects to the memory transistor drain and via switch S3 to the input of the grounded gate amplifier. Its operation is as follows. On phase φ1, the memory transistor M is connected in a closed-loop configuration with the grounded-gate amplifier G. The memory transistor's drain current settles to J+i and the gate voltage to sustain this is applied to $C_m$. The high voltage gain of the grounded gate amplifier G ensures that the voltage at the input is held nearly constant, i.e nearly independent of the signal i. Besides ensuring low $g_m/g_o$ error, this also produces a constant voltage at switch S3. At the end of phase φ'1, switch S3 opens and the voltage stored on the capacitor $C_m$ is disturbed by the switch's channel charge flowing via the amplifier G onto capicitor $C_m$. As switch S3 is held at nearly constant voltage, it will produce a nearly constant voltage error at the gate of the memory transistor M. This, however, still produces a signal-dependent error in the output current. Either or both of the techniques shown in FIGS. 2b and 2c can reduce this signal dependent error. First, because switch S3 operates at nearly constant voltage, its injected charge can be effectively cancelled by a dummy switch of approximately half width connected with both source and drain to the amplifier's input and with its gate driven by phase φ2 (FIG. 2b). Note also the optional dummy switch which connects the input switch to the drain of the memory transistor M with its gate tied permanently to the supply rail $V_{dd}$. This has the same dimensions as the output switch S2 and compensates for the voltage drop on the output switch on phase φ2. Secondly, a balanced pair or cells (FIG. 2c) may be used to give a more constant differential transconductance so that any residual error voltage at the gate of the memory transistors M translates to an offset error in the differential output current.

Figure 3:
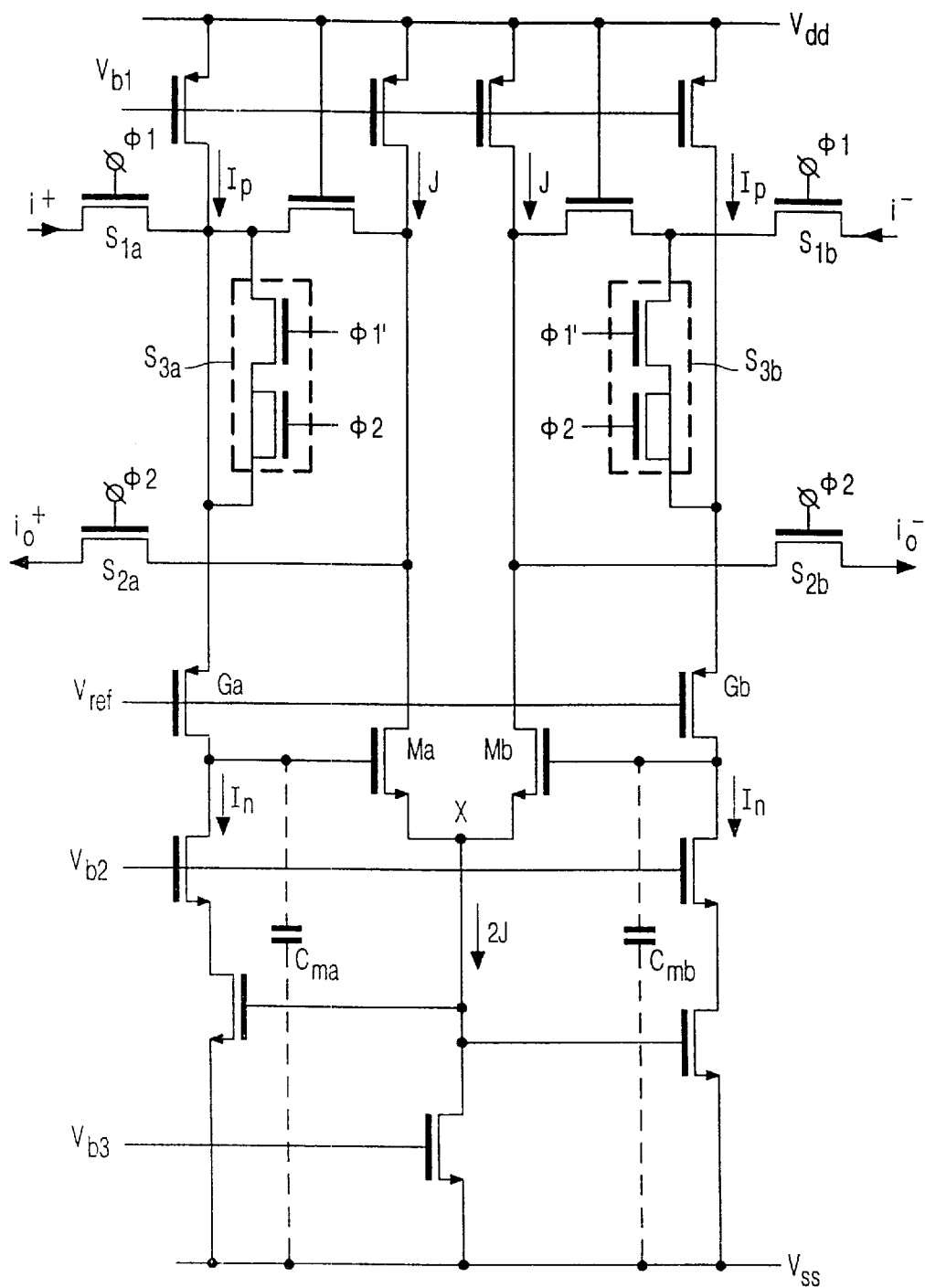
FIG. 3 shows a fourth embodiment of a current memory cell according to the invention.

FIG. 3 shows a fully differential version of the current memory circuit. It is derived from the single-ended circuit shown in FIG. 2b. It has the advantage over the balanced arrangement shown in FIG. 2c that it does not rely on transistor matching to balance the grounded gate amplifier bias currents $I_N$ and $I_P$. Instead, the cascoded $I_N$ current sources form a common-mode feedback loop with the memory transistor pair $M_a$ and $M_b$. On phase φ1, if say $I_P$ is greater than $I_N$, then the excess current $I_P$–$I_N$ flows via the memory transistors into node X causing its voltage to rise. This increases $I_N$ until it matches $I_P$.

Now consider the effect of charge injection from switches S3a and S3b. At the end of phase φ'1, the channel charges are routed via the grounded-gate amplifiers Ga and Gb onto the memory capacitors Cma and Cmb. As this causes a constant signal-independent voltage error at the memory transistor gates, this corresponds to a common-mode voltage error which disturbs node X. During phase φ2, the common-mode feedback loop remains closed and adjusts the value of $I_N$ so that momentarily it mismatches $I_P$ flowing in the amplifiers Ga and Gb. The error currents $I_P$–$I_N$ flow into the gates of the memory transistors Ma and Mb causing node X to return to its earlier value. This can only be achieved when the voltages on the gates of the memory transistors have returned to the values on phase φ1. In other words, the common-mode loop acts to cancel the charge injection errors from switches S3a and S3b.

When the input signals $i^-$, $i^+$ contain a common-mode component $I_{cm}$, this flows initially with the differential input signal into the memory transistors Ma and Mb. The consequent imbalance in the currents summing at node X causes the common-mode feedback loop to act as before, increasing $I_N$ until it matches the sum of $I_P$ and $I_{cm}$ and leaving the memory transistors Ma and Mb biased correctly. On phase φ2, the common-mode signal is disconnected from the input and the common-mode feedback loop re-adjusts the value of $I_N$ until it matches $I_P$ without affecting the currents at the output. In other words, the memory cell rejects common-mode input signals.

From reading the present disclosure, other modifications and variations will be apparent to persons skilled in the art. Such modifications and variations may involve equivalent features and other features which are already known in the art and which may be used instead of or in addition to features already disclosed herein. Although claims have been formulated in this Application to particular combinations of features, it should be understood that the scope of the disclosure of the present application includes any and every novel feature or any novel combination of features disclosed herein either explicitly or implicitly and any generalisation thereof, whether or not it relates to the same invention as presently claimed in any Claim and whether or not it mitigates any or all of the same technical problems as does the present invention. The Applicants hereby give notice that new claims may be formulated to such features and/or combinations of such features during prosecution of the present application or of any further application therefrom.

What is claimed is:

1. A switched-current memory circuit comprising
    an input which is connected
        via a first switch to a drain electrode of a first field effect transistor and
        via a second switch to a gate electrode of the first field effect transistor,
    the path between the input and the gate electrode of the first field effect transistor further including
        a grounded gate amplifier, and
    an output connected via a third switch to the drain electrode of the first field effect transistor,
    in which
        the first and second switches are closed during a first portion of a clock period and
        the third switch is closed during a second non-overlapping portion of the clock period or a subsequent clock period and
        the second switch is connected between the input of the switched current memory circuit and an input of the grounded gate amplifier.

2. A switched-current memory circuit as claimed in claim 1 in which the second switch comprises
    a second field effect transistor connected in series with
    a third field effect transistor
        whose source and drain electrodes are shorted together and
        whose gate electrode is driven during the second portion of the clock period.

3. A switched-current memory circuit as claimed in claim 2 in which
    a further field effect transistor is connected between the first switch and the drain electrode of the first field effect transistor,
    a gate electrode of the further field effect transistor being connected to a potential source which causes it to be conductive.

4. A switched-current memory circuit as claimed in claim 1 in which
    a further field effect transistor is connected between the first switch and the drain electrode of the first field effect transistor,
    a gate electrode of the further field effect transistor being connected to a potential source which causes it to be conductive.

5. A differential current memory circuit comprising
    first and second field effect transistors connected as a differential pair, first and second inputs which are connected
via respective first switches to drain electrodes of the first and second field effect transistors and
via respective second switches and respective grounded gate amplifiers to gate electrodes of the first and second field effect transistors, and
first and second outputs connected via respective third switches to the drain electrodes of the first and second field effect transistors,
wherein
the first and second respective switches are closed during a first portion of a clock period,
the third respective switches are closed during a second non-overlapping portion of the clock period or a subsequent clock period, and
the second respective switch is connected between the respective input of the differential current memory circuit and an input of the respective grounded gate amplifier.

6. A differential current memory circuit as claimed in claim 5 in which each of the respective second switches comprises
a third field effect transistor connected in series with
a fourth field effect transistor
whose source and drain electrodes are shorted together and
whose gate electrode is driven during the second portion of the clock period.

7. A differential current memory circuit as claimed in claim 6 in which
respective further field effect transistors are connected between the respective first switches and the drain electrodes of the first and second field effect transistors,
gate electrodes of the respective further field effect transistors being connected to a potential source which causes them to be conductive.

8. A differential current memory circuit as claimed in claim 7 in which
a voltage at a junction of the first and second field effect transistors is arranged to control bias currents to the grounded gate amplifiers.

9. A differential current memory circuit as claimed in claim 6 in which
a voltage at a junction of the first and second field effect transistors is arranged to control bias currents to the grounded gate amplifiers.

10. A differential current memory circuit as claimed in claim 5 in which
a voltage at a junction of the first and second field effect transistors is arranged to control bias currents to the grounded gate amplifiers.

11. A differential current memory circuit as claimed in claim 5 in which
respective further field effect transistors are connected between the respective first switches and the drain electrodes of the first and second field effect transistors,
gate electrodes of the respective further field effect transistors being connected to a potential source which causes them to be conductive.

12. A differential current memory circuit as claimed in claim 11 in which
a voltage at a junction of the first and second field effect transistors is arranged to control bias currents to the grounded gate amplifiers.

13. A memory circuit for storing balanced currents comprising
first and second identical current memory circuits each identical current memory circuit comprising:
an input which is connected
via a first switch to a drain electrode of a first field effect transistor and
via a second switch to a gate electrode of the first field effect transistor,
a path between the input and the gate electrode of the first field effect transistor further including
a grounded gate amplifier, and
an output connected via a third switch to the drain electrode of the first field effect transistor,
in which
the first and second switches are closed during a first portion of a clock period and
the third switch is closed during a second non-overlapping portion of the clock period or a subsequent clock period and
the second switch is connected between the input of the switched-current memory circuit and an input of the grounded gate amplifier.

14. A memory circuit for storing balanced currents as claimed in claim 13 in which each identical current memory circuit further includes:
a further field effect transistor that is connected between the first switch and the drain electrode of the first field effect transistor,
a gate electrode of the further field effect transistor being connected to a potential source which causes it to be conductive.

15. A memory circuit for storing balanced currents as claimed in claim 13 wherein
the second switch of each identical current memory circuit comprises
a second field effect transistor connected in series with
a third field effect transistor
whose source and drain electrodes are shorted together and
whose gate electrode is driven during the second portion of the clock period.

16. A memory circuit for storing balanced currents as claimed in claim 15 in which each identical current memory circuit further includes:
a further field effect transistor that is connected between the first switch and the drain electrode of the first field effect transistor,
a gate electrode of the further field effect transistor being connected to a potential source which causes it to be conductive.

* * * * *